(12) United States Patent
Hung et al.

(10) Patent No.: US 10,964,615 B2
(45) Date of Patent: Mar. 30, 2021

(54) CHIP-SCALE SENSOR PACKAGE STRUCTURE

(71) Applicant: KINGPAK TECHNOLOGY INC., Hsin-Chu County (TW)

(72) Inventors: Li-Chun Hung, Hsin-Chu County (TW); Chien-Chen Lee, Hsin-Chu County (TW); Hsiu-Wen Tu, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 47 days.

(21) Appl. No.: 16/454,143

(22) Filed: Jun. 27, 2019

(65) Prior Publication Data
US 2020/0273766 A1    Aug. 27, 2020

(30) Foreign Application Priority Data
Feb. 22, 2019   (TW) .................................. 108105965

(51) Int. Cl.
| H01L 23/31 | (2006.01) |
| H01L 31/02 | (2006.01) |
| H01L 31/0203 | (2014.01) |

(52) U.S. Cl.
CPC ...... H01L 23/3114 (2013.01); H01L 23/3128 (2013.01); H01L 23/3135 (2013.01); H01L 31/0203 (2013.01); H01L 31/02005 (2013.01)

(58) Field of Classification Search
CPC ............. H01L 23/3114; H01L 23/3128; H01L 23/3135; H01L 31/02005; H01L 31/0203
See application file for complete search history.

(56) References Cited

U.S. PATENT DOCUMENTS

| 7,230,247 B2* | 6/2007 | Shibayama ....... H01L 27/14636 250/370.11 |
| 7,419,841 B2* | 9/2008 | Farnworth ............ H01L 23/481 257/E23.011 |
| 8,269,300 B2* | 9/2012 | Chien ............... H01L 27/14618 257/434 |

(Continued)

FOREIGN PATENT DOCUMENTS

| TW | 201503334 A | 1/2015 |
| TW | 201836089 A | 10/2018 |

*Primary Examiner* — Ida M Soward
(74) *Attorney, Agent, or Firm* — Li & Cai Intellectual Property (USA) Office

(57) ABSTRACT

A chip-scale sensor package structure includes a sensor chip, a ring-shaped support disposed on a top surface of the sensor chip, a light permeable member disposed on the ring-shaped support, a package body, and a redistribution layer (RDL). The package body surrounds outer lateral sides of the sensor chip, the ring-shaped support and the light permeable member. A bottom surface of the sensor chip and a surface of the light permeable member are exposed from the package body. The RDL is directly formed on the bottom surface of the sensor chip and a bottom side of the package body. The RDL includes a plurality of external contacts arranged on a bottom surface thereof and electrically coupled to the sensor chip. A portion of the external contacts are arranged outside of a projection region defined by orthogonally projecting the sensor chip onto the bottom surface of the RDL.

11 Claims, 7 Drawing Sheets

(56) References Cited

U.S. PATENT DOCUMENTS

| | | | |
|---|---|---|---|
| 8,431,977 B2* | 4/2013 | Yang | H01L 24/13 |
| | | | 257/294 |
| 2006/0068580 A1* | 3/2006 | Dotta | H01L 27/14618 |
| | | | 438/612 |
| 2006/0261340 A1 | 11/2006 | Farnworth et al. | |
| 2008/0211075 A1* | 9/2008 | Yang | H01L 27/14618 |
| | | | 257/680 |
| 2012/0068356 A1* | 3/2012 | Ahles | H01L 21/764 |
| | | | 257/774 |
| 2014/0203387 A1* | 7/2014 | Suen | H01L 24/92 |
| | | | 257/431 |
| 2015/0011038 A1 | 1/2015 | Huang et al. | |
| 2018/0265347 A1 | 9/2018 | Lee et al. | |
| 2019/0103429 A1* | 4/2019 | Hsu | H01L 27/14636 |
| 2019/0181172 A1* | 6/2019 | Kim | H01L 23/16 |
| 2020/0135790 A1* | 4/2020 | Kim | H01L 27/1469 |

\* cited by examiner

CHIP-SCALE SENSOR PACKAGE STRUCTURE

CROSS-REFERENCE TO RELATED PATENT APPLICATION

This application claims the benefit of priority to Taiwan Patent Application No. 108105965, filed on Feb. 22, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a chip-scale sensor package structure.

BACKGROUND OF THE DISCLOSURE

A light permeable member (e.g., an optical glass) of a conventional chip-scale sensor package structure is mounted simply through adhering a bottom edge of the light permeable member with a glue layer, and the area size of the light permeable member is substantially equal to that of the conventional chip-scale sensor package structure. As a result, when the conventional chip-scale sensor package structure is subjected to a temperature cycle test (TCT), a delamination phenomena may easily occur between the light permeable member and the glue layer, and the conventional package structure is unable to pass in the TCT.

SUMMARY OF THE DISCLOSURE

In response to the above-referenced technical inadequacies, the present disclosure provides a chip-scale sensor package structure to effectively prevent from drawbacks associated with conventional chip-scale sensor package structures.

In one aspect, the present disclosure provides a chip-scale sensor package structure, which includes a sensor chip, a ring-shaped support, a light permeable member, a package body, and a redistribution layer (RDL). The sensor chip includes a sensing region arranged on a top surface thereof, a plurality of internal contacts arranged on a bottom surface thereof, and a plurality of conducting paths extending through the sensor chip from the top surface to the bottom surface. The conducting paths are respectively connected to the internal contacts and are electrically coupled to the sensing region. The ring-shaped support is disposed on the top surface of the sensor chip and is arranged on an outer side of the sensing region. The light permeable member includes a first surface and a second surface opposite to the first surface. The second surface of the light permeable member is disposed on the ring-shaped support, and the light permeable member, the ring-shaped support, and the sensor chip jointly surround and form an enclosed space. The package body surrounds outer lateral sides of the sensor chip, outer lateral sides of the ring-shaped support, and outer lateral sides of the light permeable member. The bottom surface of the sensor chip and the first surface of the light permeable member are exposed from the package body. The RDL is directly formed on the bottom surface of the sensor chip and a bottom side of the package body. The RDL includes a plurality of external contacts arranged on a bottom surface thereof and electrically coupled to the internal contacts. A portion of the external contacts are arranged outside of an area spanned by orthogonal projections of the internal contacts onto the bottom surface of the RDL.

Therefore, since the chip-scale sensor package structures disclosed in the embodiments of the present disclosure have incorporated the structural modification (e.g., the RDL is directly formed on the bottom surface of the sensor chip and the bottom side of the package body), the outer lateral sides of the light permeable member can be covered by the package body for enhancing bonding strength of the light permeable member within the chip-scale sensor package structure. Accordingly, when the chip-scale sensor package structure is subjected to a temperature cycle test (TCT), a delamination defect of the light permeable member can be avoided.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1A:
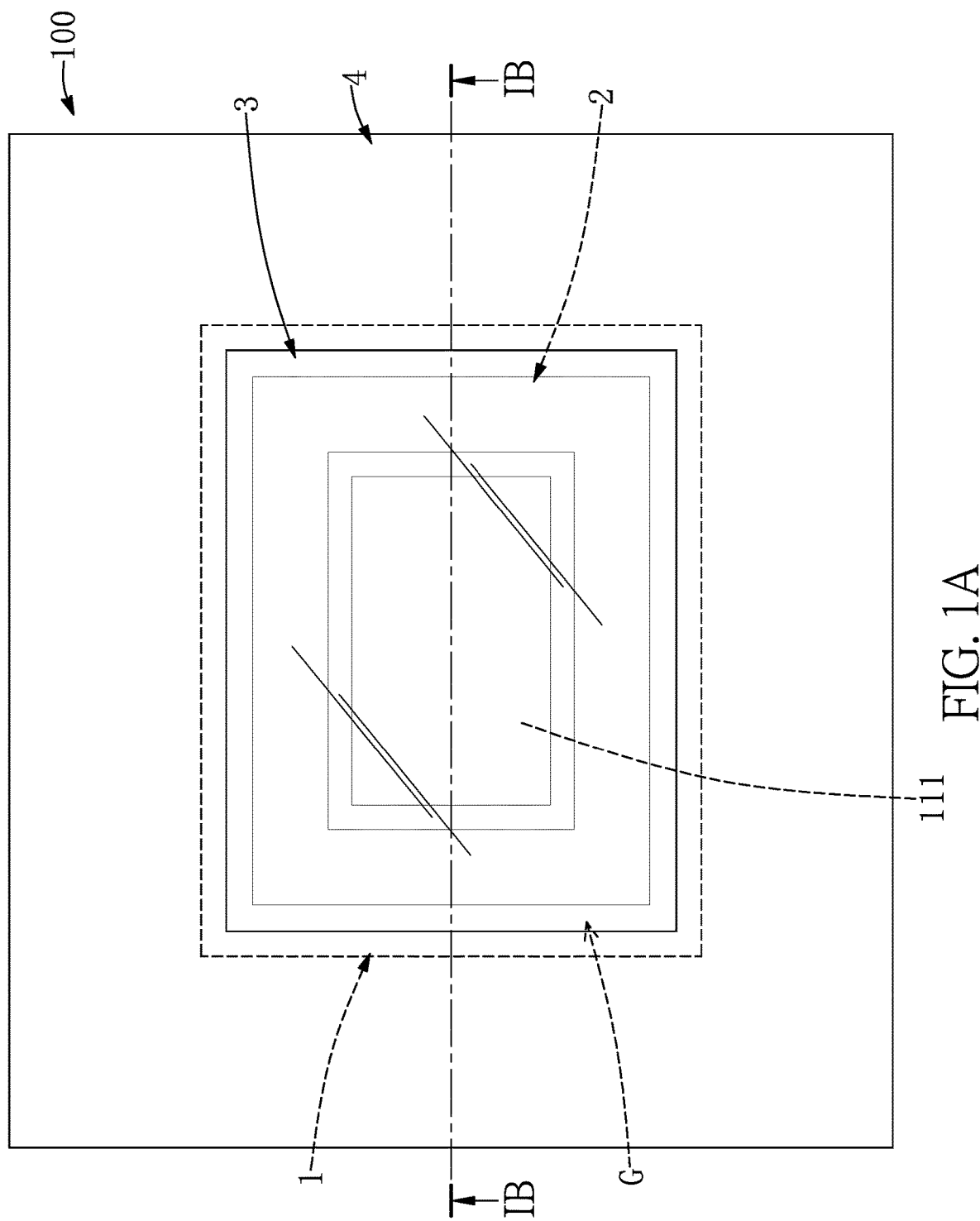
FIG. 1A is a top view of a chip-scale sensor package structure according to a first embodiment of the present disclosure.

Please refer to FIG. 1A to FIG. 6, which illustrate the embodiments of the disclosure. It should be noted that the accompanying drawings, associated quantities and appearances in the embodiments are simply used for specifically illustrating implementation methods of the disclosure, making the disclosure more understandable, not for limiting scope of the disclosure.

First Embodiment

As shown in FIG. 1A to FIG. 5, which illustrate a first embodiment of the present disclosure, a chip-scale sensor package structure 100 is provided. It is emphasized that, to any sensor package structure with a size not fitting "chip-scale", the basis of structural design is different from that of the chip-scale sensor package structure 100 of the present embodiment, so there is no ground for comparing these two kinds of package structures.

The chip-scale sensor package structure 100 includes a sensor chip 1, a ring-shaped support 2 disposed on the sensor chip 1, a light permeable member 3 disposed on the ring-shaped support 2, a package body 4 surrounding the above components (i.e., the sensor chip 1, the ring-shaped support 2, and the light permeable member 3), a redistribution layer (RDL) 5 formed on bottoms of the package body 4 and the sensor chip 1, and a plurality of solder balls 6 disposed on an outer surface of the RDL 5.

Figure 1B:
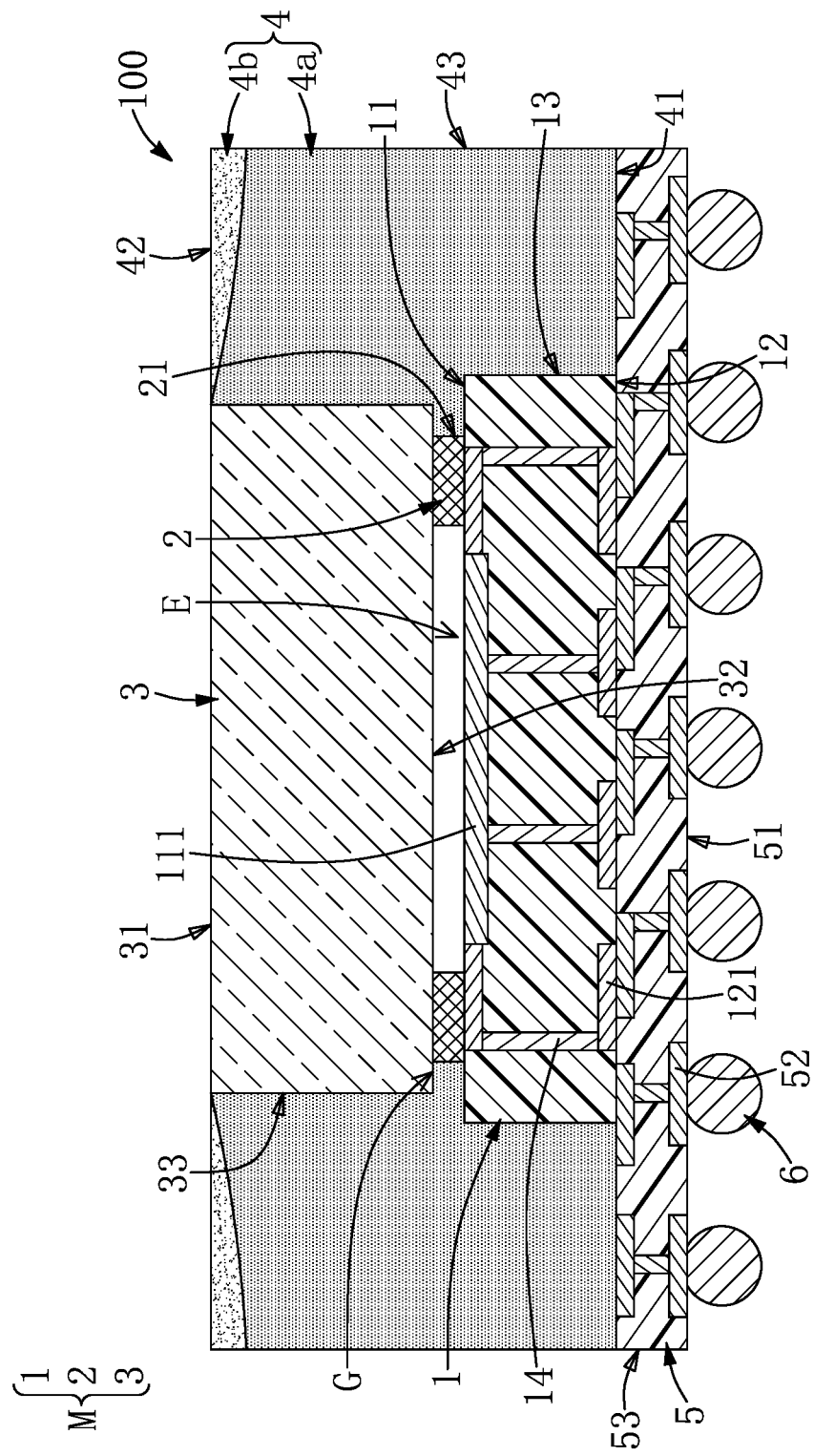
FIG. 1B is a cross-sectional view taken along line IB-IB of FIG. 1A.

It should be noted that the drawings of the present embodiment are cross-sectional views for the sake of easily describing the chip-scale sensor package structure 100 of the present embodiment, and portions of the chip-scale sensor package structure 100 not shown in the drawings shall be formed with corresponding structures as well. For example, FIG. 1B shows only one row of solder balls 6, but portions of the chip-scale sensor package structure 100 not shown in FIG. 1B include other solder balls 6. The following description recites the structure and connection relationship of each component of the chip-scale sensor package structure 100.

As shown in FIG. 1B, the sensor chip 1 in the present embodiment is illustrated by taking it as an image sensing chip, but the present disclosure is not limited thereto. An outer surface of the sensor chip 1 includes a top surface 11, a bottom surface 12 opposite to the top surface 11, and outer lateral sides 13 connecting the top surface 11 and the bottom surface 12. The top surface 11 of the sensor chip 1 has a sensing region 111 arranged on a substantial center portion thereof. The sensor chip 1 includes a plurality of internal contacts 121 arranged on the bottom surface 12. The sensor chip 1 further includes a plurality of conducting paths 14 extending through the sensor chip 1 from the top surface 11 to the bottom surface 12, and the conducting paths 14 are respectively connected to the internal contacts 121 and are electrically coupled to the sensing region 111.

The ring-shaped support 2 is disposed on the top surface 11 of the sensor chip 1 and is arranged on the outer side of (or around) the sensing region 111. The ring-shaped support 2 in the present embodiment is made of an adhesive. Along a horizontal direction of FIG. 1A and FIG. 1B, an outer diameter of the ring-shaped support 2 is less than that of the sensor chip 1. That is to say, outer lateral sides 21 of the ring-shaped support 2 is separated from the outer lateral sides 13 of the sensor chip 1 by a distance, but the present disclosure is not limited thereto.

The light permeable member 3 includes a first surface 31, a second surface 32 opposite to the first surface 31, and outer lateral sides 33 connecting the first surface 31 and the second surface 32. The second surface 32 of the light permeable member 3 is disposed on the ring-shaped support 2 (i.e., the ring-shaped support 2 is sandwiched between the top surface 11 of the sensor chip 1 and the second surface 32 of the light permeable member 3), so that the light permeable member 3, the ring-shaped support 2, and the sensor chip 1 jointly surround and form an enclosed space E.

The light permeable member 3 in the present embodiment is a transparent glass plate. Along the horizontal direction of FIG. 1A and FIG. 1B, an outer diameter of the light permeable member 3 is less than that of the sensor chip 1. In other words, a projection area defined by orthogonally projecting the light permeable member 3 onto the top surface 11 of the sensor chip 1 is located inside of the outer lateral sides 13 of the sensor chip 1, but the present disclosure is not limited thereto. Moreover, along the horizontal direction of FIG. 1A and FIG. 1B, the outer diameter of the light permeable member 3 is larger than that of the ring-shaped support 2, so that the top surface 11 of the sensor chip 1, the outer lateral sides 21 of the ring-shaped support 2, and the second surface 32 of the light permeable member 3 jointly surround and form a ring-shaped groove G.

However, in other embodiments not shown in the present disclosure, the outer diameter of the light permeable member 3 can be equal to or larger than that of the sensor chip 1, and the outer diameter of the ring-shaped support 2 can be equal to that of the sensor chip 1. Or, at any one side edge of the chip-scale sensor package structure 100, the corresponding outer lateral side 13 of the sensor chip 1, the corresponding outer lateral side 21 of the ring-shaped support 2 and the corresponding outer lateral side 33 of the light permeable member 3 can be coplanar (or flush) with each other.

The package body 4 is in a ring-shape and surrounds the outer lateral sides 13 of the sensor chip 1, the outer lateral sides 21 of the ring-shaped support 2, and the outer lateral sides 33 of the light permeable member 3. The ring-shaped groove G is filled by the package body 4. The bottom surface 12 of the sensor chip 1 and the first surface 31 of the light permeable member 3 are exposed from the package body 4, and the bottom surface 12 of the sensor chip 1 in the present embodiment is coplanar with a bottom side 41 of the package body 4.

Specifically, the package body 4 includes a solidified liquid compound 4a and a molding compound 4b. The solidified liquid compound 4a surrounds the outer lateral sides 13 of the sensor chip 1, the outer lateral sides 21 of the ring-shaped support 2, and the outer lateral sides 33 of the light permeable member 3. The bottom surface 12 of the sensor chip 1 is coplanar with a bottom side of the solidified liquid compound 4a. The molding compound 4b is formed on a top side of the solidified liquid compound 4a, and outer lateral sides of the solidified liquid compound 4a are respectively flush with those of the molding compound 4b at the side edges of the chip-scale sensor package structure 100.

However, in other embodiments not depicted in the present disclosure, the package body 4 can solely be the solidified liquid compound 4a (i.e., the molding compound 4b of the package body 4 shown in FIG. 1B is omitted); or the package body 4 can solely be the molding compound 4b, and a top side 42 of the package body 4 is coplanar with the first surface 31 of the light permeable member 3.

The RDL 5 is directly formed on the bottom surface 12 of the sensor chip 1 and the bottom side 41 of the package body 4. At the side edges of the chip-scale sensor package structure 100, the outer lateral sides 43 of the package body 4 in the present embodiment are preferably coplanar with the outer lateral sides 53 of the RDL 5, respectively, but the present disclosure is not limited thereto.

The RDL 5 includes a plurality of external contacts 52 arranged on a bottom surface 51 thereof and electrically coupled to the internal contacts 121. Specifically, the internal contacts 121 of the sensor chip 1 can connect to the plurality of external contacts 52 having larger intervals through the RDL 5 (i.e., the RDL 5 amounts to a circuit fan-out structure). In other words, a portion of the external contacts 52 are arranged outside of an area spanned by orthogonal projections of the internal contacts 121 onto the bottom surface 51 of the RDL 5, and a portion of the RDL 5 arranged under the package body 4 is preferably formed with at least a portion of the external contacts 52, but the present disclosure is not limited thereto.

Moreover, the solder balls 6 are respectively disposed on the bottom surface 51 of the RDL 5 (e.g., the external contacts 52). Accordingly, the chip-scale sensor package structure 100 can be soldered onto an electronic component (e.g., a printed circuit board) through the solder balls 6, thereby electrically connecting the chip-scale sensor package structure 100 to the electronic component.

The above paragraphs are a description of the structure of the chip-scale sensor package structure 100. In order to more clearly understand the present embodiment, a method for manufacturing the chip-scale sensor package structure 100 is recited in the following. However, the chip-scale sensor package structure 100 of the present embodiment is not limited to be manufactured by the method. The method for manufacturing the chip-scale sensor package structure 100 includes a preparing step S110, a packaging step S130, an inverting layout step S150, and a ball placement step S170, and the following description briefly discloses the above steps S110-S170.

Figure 2:
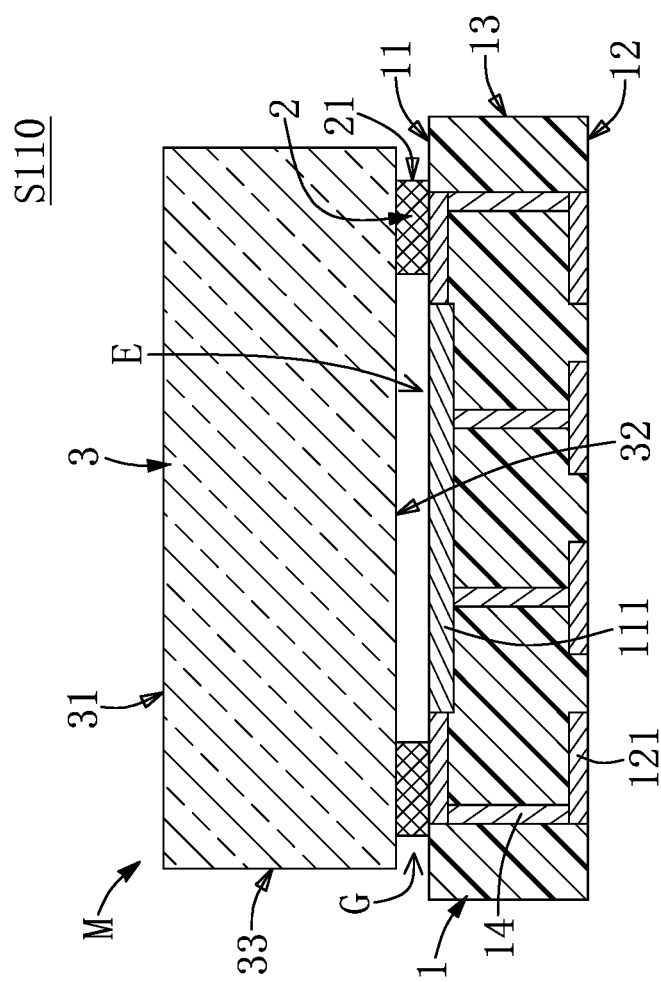
FIG. 2 is a cross-sectional view showing step S110 of a method for manufacturing the chip-scale sensor package structure according to the first embodiment of the present disclosure.

As shown in FIG. 2, the preparing step S110 is implemented by providing a semi-finished product M. The semi-finished product M includes the sensor chip 1, the ring-shaped support 2 disposed on the sensor chip 1, and the light permeable member 3 disposed on the ring-shaped support 2.

Figure 3:
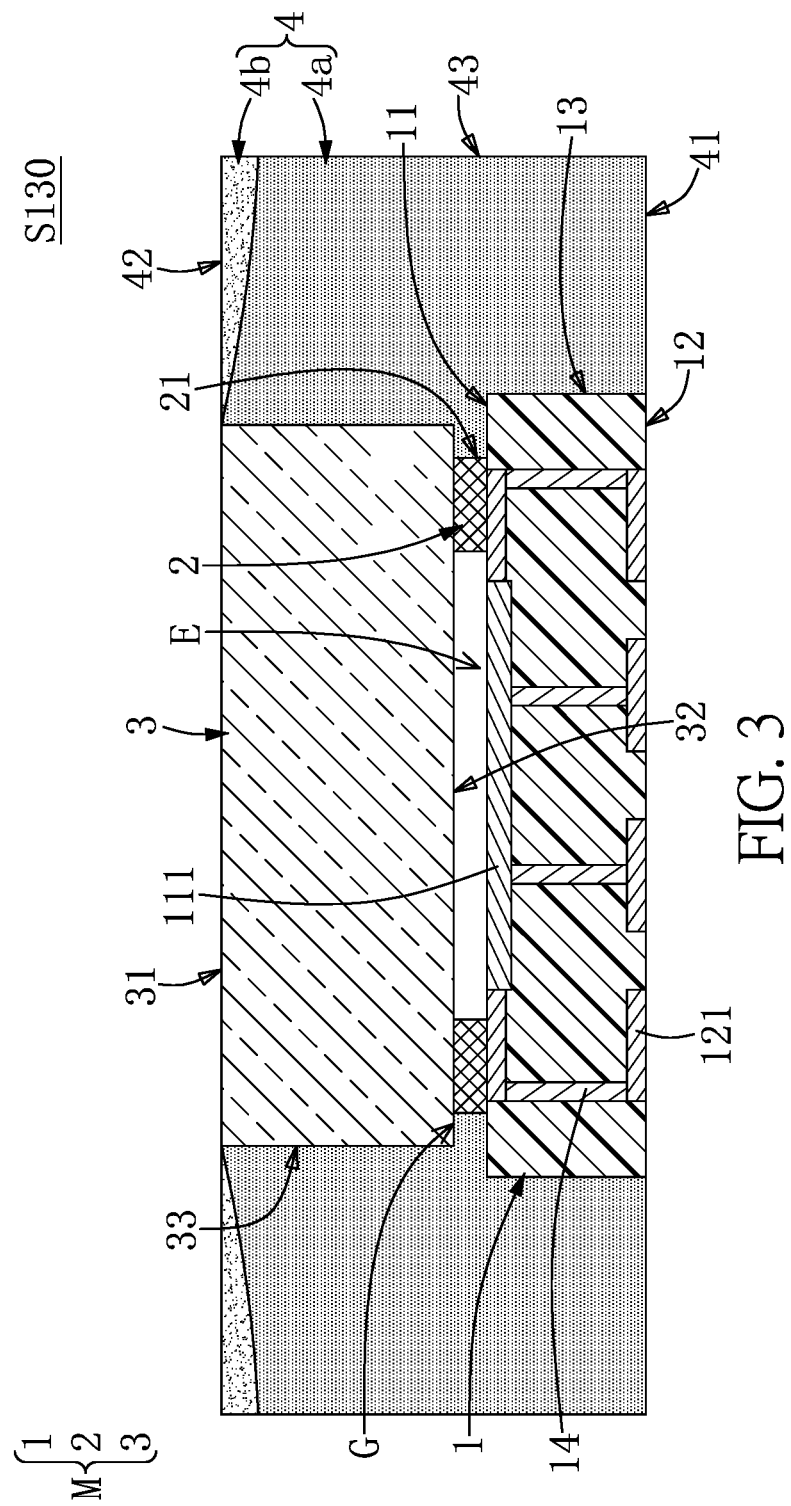
FIG. 3 is a cross-sectional view showing step S130 of the method according to the first embodiment of the present disclosure.

As shown in FIG. 3, the packaging step S130 is implemented by forming the package body 4 onto outer lateral sides of the semi-finished product M, in which the bottom side 41 of the package body 4 is coplanar with the bottom surface 12 of the sensor chip 1 of the semi-finished product M.

Figure 4:
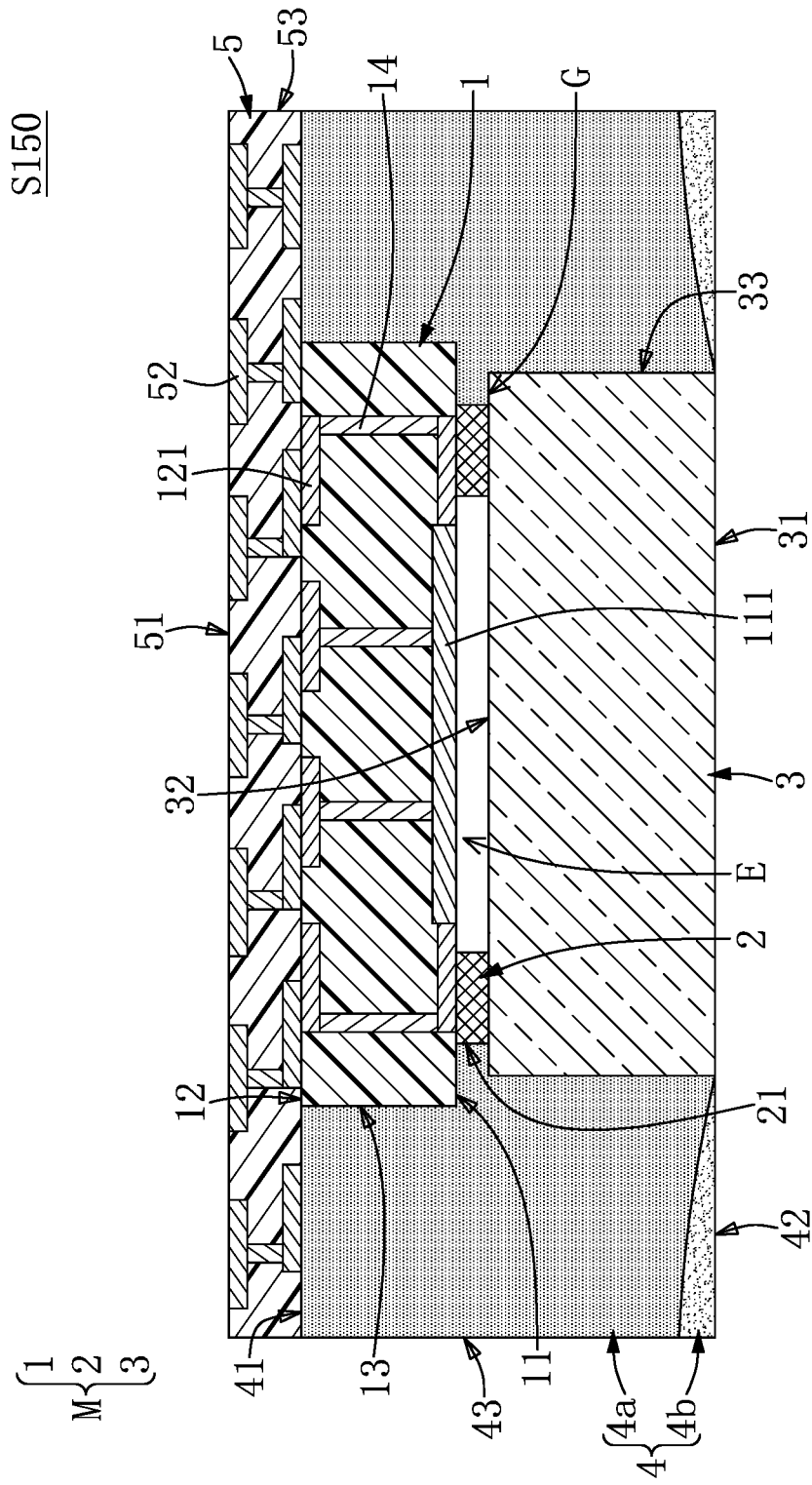
FIG. 4 is a cross-sectional view showing step S150 of the method according to the first embodiment of the present disclosure.

As shown in FIG. 4, the inverting layout step S150 is implemented by inverting the semi-finished product M and the package body 4 formed on the outer lateral sides of the semi-finished product M, and forming the RDL 5 onto the bottom side 41 of the package body 4 and the bottom surface 12 of the sensor chip 1 that is coplanar with the bottom side 41. The external contacts 52 of the RDL 5 are electrically coupled to the internal contacts 121, respectively.

Figure 5:
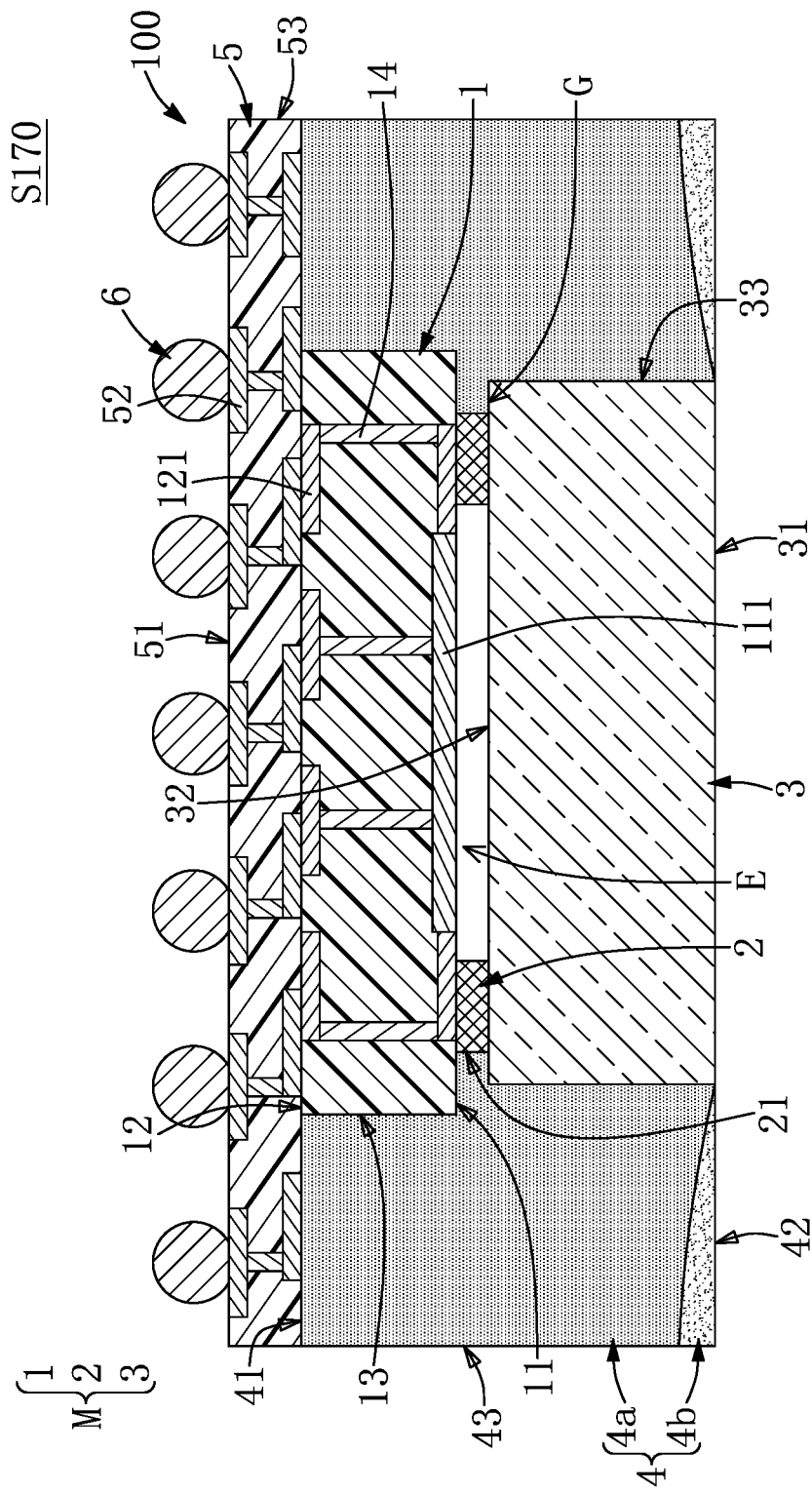
FIG. 5 is a cross-sectional view showing step S170 of the method according to the first embodiment of the present disclosure.

As shown in FIG. 5, the ball placement step S170 is implemented by respectively mounting the solder balls 6 onto the external contacts 52 of the RDL 5.

Second Embodiment

Figure 6:
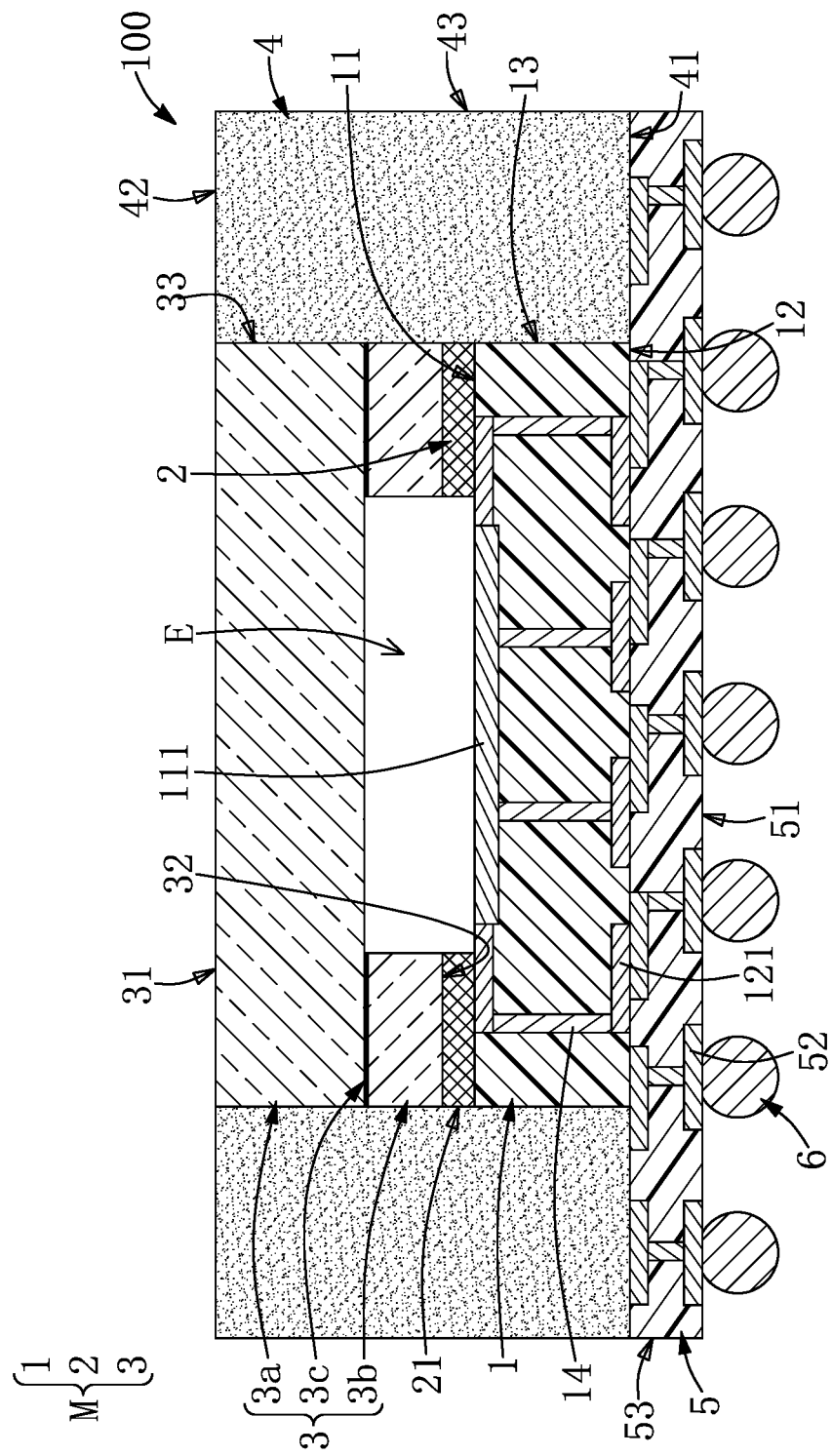
FIG. 6 is a cross-sectional view of a chip-scale sensor package structure according to a second embodiment of the present disclosure.

Referring to FIG. 6 which is a second embodiment of the present disclosure, the second embodiment is similar to the above first embodiment, hence the identical parts in the two embodiments (e.g., the sensor chip 1, the RDL 5, and the solder balls 6) shall not be recited again. The differences between the embodiments are described as below.

In the present embodiment, at any one side edge of the chip-scale sensor package structure 100, the outer lateral side 13 of the sensor chip 1, the outer lateral side 21 of the ring-shaped support 2, and the outer lateral side 33 of the light permeable member 3 are coplanar (or flush) with each other. The package body 4 is solely a molding compound, and a top side of the package body 4 is coplanar with the first surface 31 of the light permeable member 3.

Specifically, the light permeable member 3 is a transparent glass and includes a board portion 3a, a ring-shaped supporting portion 3b, and a connecting layer 3c bonding the board portion 3a and the supporting portion 3b. Moreover, a surface of the board portion 3a (e.g., a top surface of the board portion 3a shown in FIG. 6) arranged away from the supporting portion 3b is defined as the first surface 31, and a surface of the supporting portion 3b (e.g., a bottom surface of the supporting portion 3b shown in FIG. 6) arranged away from the board portion 3a is defined as the second surface 32. The supporting portion 3b substantially corresponds in shape to the ring-shaped support 2, and the connecting layer 3c can be a silicone layer, an epoxy layer, or a welding layer.

In addition, in other embodiments not depicted in the present disclosure, the light permeable member 3 can be formed without the connecting layer 3c. That is to say, the board portion 3a and the supporting portion 3b of the light permeable member 3 can be integrally formed as a one-piece structure.

In conclusion, the chip-scale sensor package structures disclosed in the embodiments of the present disclosure have incorporated the structural modification (e.g., the RDL is directly formed on the bottom surface of the sensor chip and the bottom side of the package body), so that the outer lateral sides of the light permeable member can be covered by the package body for enhancing bonding strength of the light permeable member within the chip-scale sensor package structure. Accordingly, when the chip-scale sensor package structure is subjected to a temperature cycle test (TCT), a delamination defect of the light permeable member can be avoided.

Moreover, in the chip-scale sensor package structure of the present disclosure, since the bottom surface of the sensor chip is coplanar with the bottom side of the package body, the RDL may be easily formed. The ring-shaped groove surrounded and formed jointly by the sensor chip, the ring-shaped support, and the light permeable member is filled by the package body, so that bonding strength of the light permeable member within the chip-scale sensor package structure can be further enhanced.

In addition, the light permeable member of the chip-scale sensor package structure in the present disclosure can be formed by the board portion and the supporting portion, thereby the enclosed space can be enlarged, and a vertical distance between the sensing region of the sensor chip and the light permeable member is also lengthened. Therefore, affection to the sensing result of the sensor chip, caused by blemish adhered to the board portion, can be lowered.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:
1. A chip-scale sensor package structure, comprising:
 a sensor chip including a sensing region arranged on a top surface thereof, a plurality of internal contacts arranged on a bottom surface thereof, and a plurality of conducting paths extending through the sensor chip from the top surface to the bottom surface, wherein the conduct- ing paths are respectively connected to the internal contacts and are electrically coupled to the sensing region;

a ring-shaped support disposed on the top surface of the sensor chip and arranged on an outer side of the sensing region;

a light permeable member including a first surface and a second surface opposite to the first surface, wherein the second surface of the light permeable member is disposed on the ring-shaped support, and the light permeable member, the ring-shaped support, and the sensor chip jointly surround and form an enclosed space;

a package body surrounding outer lateral sides of the sensor chip, outer lateral sides of the ring-shaped support, and outer lateral sides of the light permeable member, wherein the bottom surface of the sensor chip and the first surface of the light permeable member are exposed from the package body; and a redistribution layer (RDL) directly formed on the bottom surface of the sensor chip and a bottom side of the package body, wherein the RDL includes a plurality of external contacts arranged on a bottom surface thereof and electrically coupled to the internal contacts, and wherein a distance between two of the external contacts distant from each other is greater than a distance between two of the internal contacts distant from each other;

wherein the bottom surface of the sensor chip is coplanar with the bottom side of the package body.

2. The chip-scale sensor package structure according to claim 1, wherein the first surface of the light permeable member is coplanar with a top side of the package body.

3. The chip-scale sensor package structure according to claim 1, wherein the package body includes:

a solidified liquid compound surrounding the outer lateral sides of the sensor chip, the outer lateral sides of the ring-shaped support, and the outer lateral sides of the light permeable member, wherein the bottom surface of the sensor chip is coplanar with a bottom side of the solidified liquid compound; and a molding compound formed on a top side of the solidified liquid compound.

4. The chip-scale sensor package structure according to claim 1, wherein the top surface of the sensor chip, the outer lateral sides of the ring-shaped support, and the second surface of the light permeable member jointly surround and form a ring-shaped groove filled by the package body.

5. The chip-scale sensor package structure according to claim 4, wherein a projection area defined by orthogonally projecting the light permeable member onto the top surface of the sensor chip is located inside of the outer lateral sides of the sensor chip.

6. The chip-scale sensor package structure according to claim 1, wherein at any one side edge of the chip-scale sensor package structure, the corresponding outer lateral side of the sensor chip, the corresponding outer lateral side of the ring-shaped support, and the corresponding outer lateral side of the light permeable member are coplanar with each other.

7. The chip-scale sensor package structure according to claim 1, wherein at any one side edge of the chip-scale sensor package structure, the corresponding outer lateral side of the package body is coplanar with the corresponding outer lateral side of the RDL.

8. The chip-scale sensor package structure according to claim 1, wherein the light permeable member includes a board portion, a ring-shaped supporting portion, and a connecting layer bonding the board portion and the supporting portion, and wherein a surface of the board portion arranged away from the supporting portion is defined as the first surface, and a surface of the supporting portion arranged away from the board portion is defined as the second surface.

9. The chip-scale sensor package structure according to claim 8, wherein the connecting layer is a silicone layer, an epoxy layer, or a welding layer.

10. A chip-scale sensor package structure, comprising:

a sensor chip including a sensing region arranged on a top surface thereof, a plurality of internal contacts arranged on a bottom surface thereof, and a plurality of conducting paths extending through the sensor chip from the top surface to the bottom surface, wherein the conducting paths are respectively connected to the internal contacts and are electrically coupled to the sensing region;

a ring-shaped support disposed on the top surface of the sensor chip and arranged on an outer side of the sensing region;

a light permeable member including a first surface and a second surface opposite to the first surface, wherein the second surface of the light permeable member is disposed on the ring-shaped support, and the light permeable member, the ring-shaped support, and the sensor chip jointly surround and form an enclosed space;

a package body surrounding outer lateral sides of the sensor chip, outer lateral sides of the ring-shaped support, and outer lateral sides of the light permeable member, wherein the bottom surface of the sensor chip and the first surface of the light permeable member are exposed from the package body; and a redistribution layer (RDL) directly formed on the bottom surface of the sensor chip and a bottom side of the package body, wherein the RDL includes a plurality of external contacts arranged on a bottom surface thereof and electrically coupled to the internal contacts, and wherein a distance between two of the external contacts distant from each other is greater than a distance between two of the internal contacts distant from each other;

wherein the top surface of the sensor chip, the outer lateral sides of the ring-shaped support, and the second surface of the light permeable member jointly surround and form a ring-shaped groove filled by the package body.

11. A chip-scale sensor package structure, comprising:

a sensor chip including a sensing region arranged on a top surface thereof, a plurality of internal contacts arranged on a bottom surface thereof, and a plurality of conducting paths extending through the sensor chip from the top surface to the bottom surface, wherein the conducting paths are respectively connected to the internal contacts and are electrically coupled to the sensing region;

a ring-shaped support disposed on the top surface of the sensor chip and arranged on an outer side of the sensing region;

a light permeable member including a first surface and a second surface opposite to the first surface, wherein the second surface of the light permeable member is disposed on the ring-shaped support, and the light permeable member, the ring-shaped support, and the sensor chip jointly surround and form an enclosed space;

a package body surrounding outer lateral sides of the sensor chip, outer lateral sides of the ring-shaped support, and outer lateral sides of the light permeable member, wherein the bottom surface of the sensor chip and the first surface of the light permeable member are exposed from the package body; and a redistribution layer (RDL) directly formed on the bottom surface of the sensor chip and a bottom side of the package body, wherein the RDL includes a plurality of external contacts arranged on a bottom surface thereof and electrically coupled to the internal contacts, and wherein a distance between two of the external contacts distant from each other is greater than a distance between two of the internal contacts distant from each other;

wherein at any one side edge of the chip-scale sensor package structure, the corresponding outer lateral side of the sensor chip, the corresponding outer lateral side of the ring-shaped support, and the corresponding outer lateral side of the light permeable member are coplanar with each other.

* * * * *